United States Patent
Tsai et al.

(10) Patent No.: US 8,212,143 B2
(45) Date of Patent: *Jul. 3, 2012

(54) THIN FILM SOLAR CELL AND MANUFACTURING METHOD THEREOF

(75) Inventors: Chin-Yao Tsai, Tainan County (TW); Chien-Sheng Yang, Tainan (TW)

(73) Assignee: Auria Solar Co., Ltd., Tainan (TW)

( * ) Notice: Subject to any disclaimer, the term of this patent is extended or adjusted under 35 U.S.C. 154(b) by 84 days.

This patent is subject to a terminal disclaimer.

(21) Appl. No.: 12/842,048

(22) Filed: Jul. 23, 2010

(65) Prior Publication Data

US 2011/0017271 A1    Jan. 27, 2011

(30) Foreign Application Priority Data

| Jul. 24, 2009 | (TW) | ................ | 98125100 A |
| Nov. 20, 2009 | (TW) | ................ | 98139575 A |
| Dec. 17, 2009 | (TW) | ................ | 98143392 A |
| Dec. 17, 2009 | (TW) | ................ | 98143393 A |
| Dec. 17, 2009 | (TW) | ................ | 98143398 A |

(51) Int. Cl.
*H01L 31/042* (2006.01)
*H01L 31/00* (2006.01)

(52) U.S. Cl. ........ 136/252; 136/244; 136/249; 136/256; 136/265

(58) Field of Classification Search .............. 136/244, 136/249, 251, 252, 256, 259, 265
See application file for complete search history.

(56) References Cited

U.S. PATENT DOCUMENTS

| 4,872,925 A | 10/1989 | McMaster | |
| 5,230,746 A | 7/1993 | Wiedeman et al. | |
| 5,507,880 A * | 4/1996 | Ishikawa et al. | ............... 136/251 |
| 6,265,652 B1 * | 7/2001 | Kurata et al. | ................ 136/244 |
| 2011/0120534 A1 * | 5/2011 | Tsai | ............................... 136/252 |
| 2011/0209750 A1 * | 9/2011 | Tsai et al. | ..................... 136/255 |

* cited by examiner

*Primary Examiner* — Basia Ridley
*Assistant Examiner* — Lindsey Bernier
(74) *Attorney, Agent, or Firm* — Morris Manning & Martin LLP; Tim Tingkang Xia, Esq.

(57) ABSTRACT

A thin film solar cell including a substrate, a first conductive layer, a photoelectric conversion layer, a second conductive layer and a passivation layer is provided. The first conductive layer disposed on the substrate has a plurality of first openings, so as to divide the first conductive layer into bottom electrodes of a plurality of photovoltaic elements. The photoelectric conversion layer disposed on the first conductive layer has a plurality of second openings. The second conductive layer is disposed on the photoelectric conversion layer and electrically connected to the first conductive layer through the second openings. The passivation layer is disposed on the sidewall of the photoelectric conversion layer, so that the second conductive layer in the second openings is electrically isolated from the photoelectric conversion layer. A manufacturing method of the thin film solar cell is also provided.

1 Claim, 16 Drawing Sheets

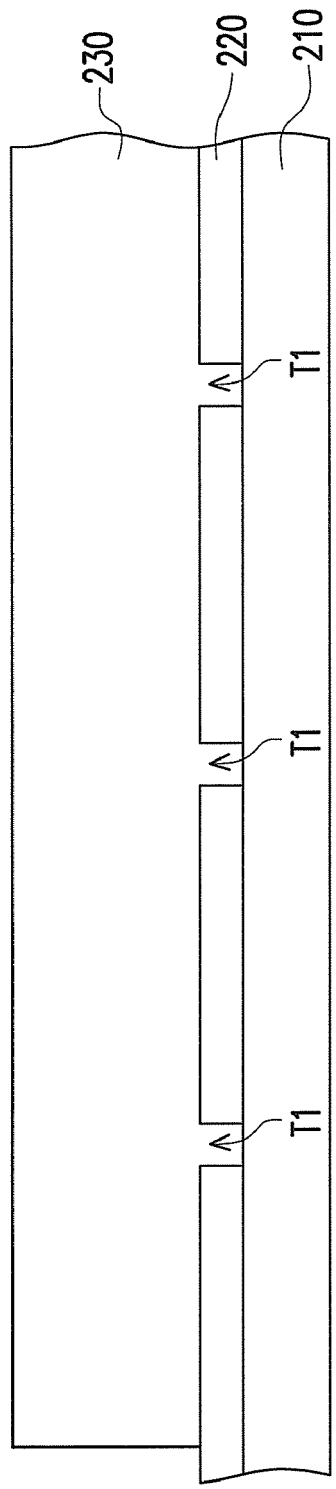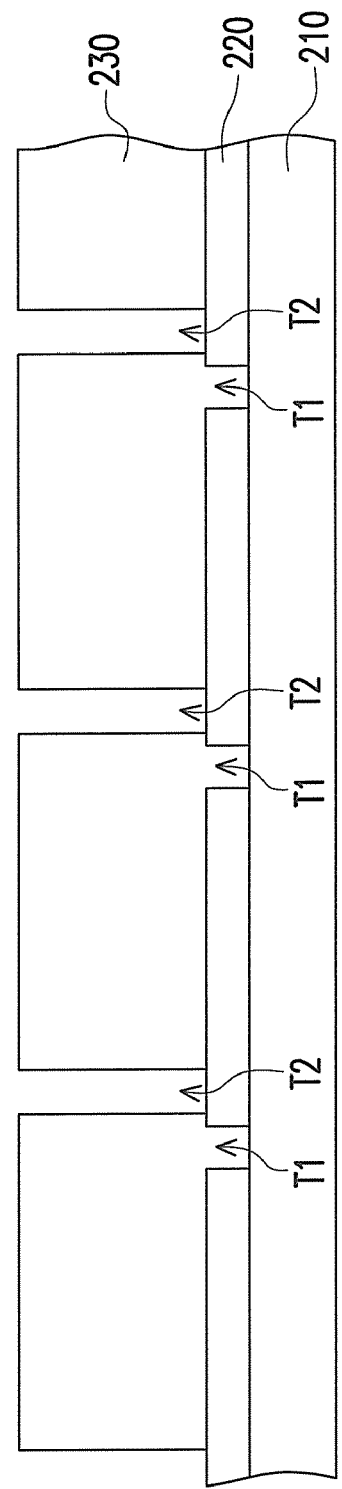
FIG. 4D
FIG. 4E

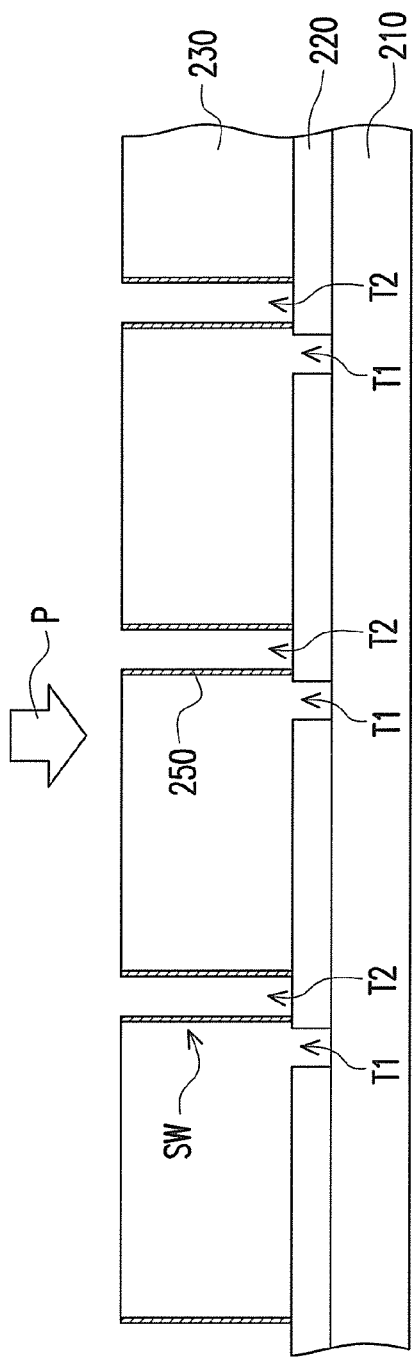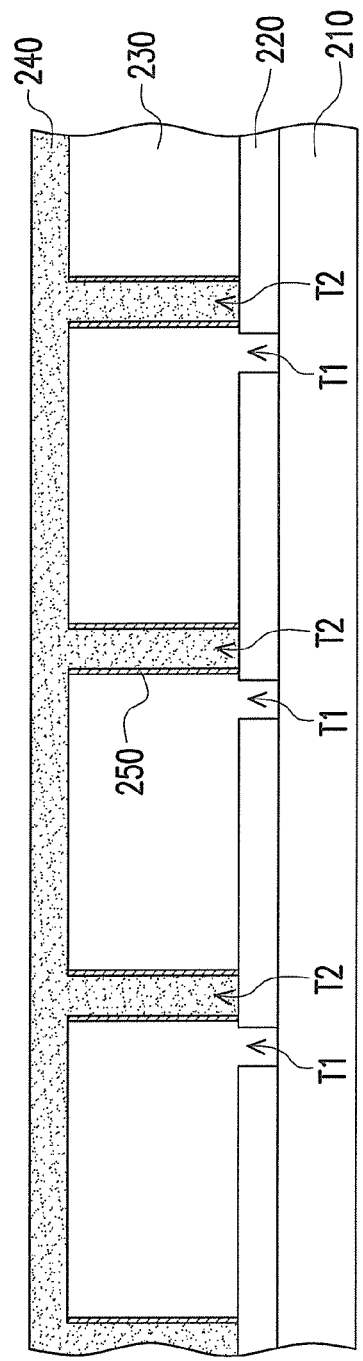

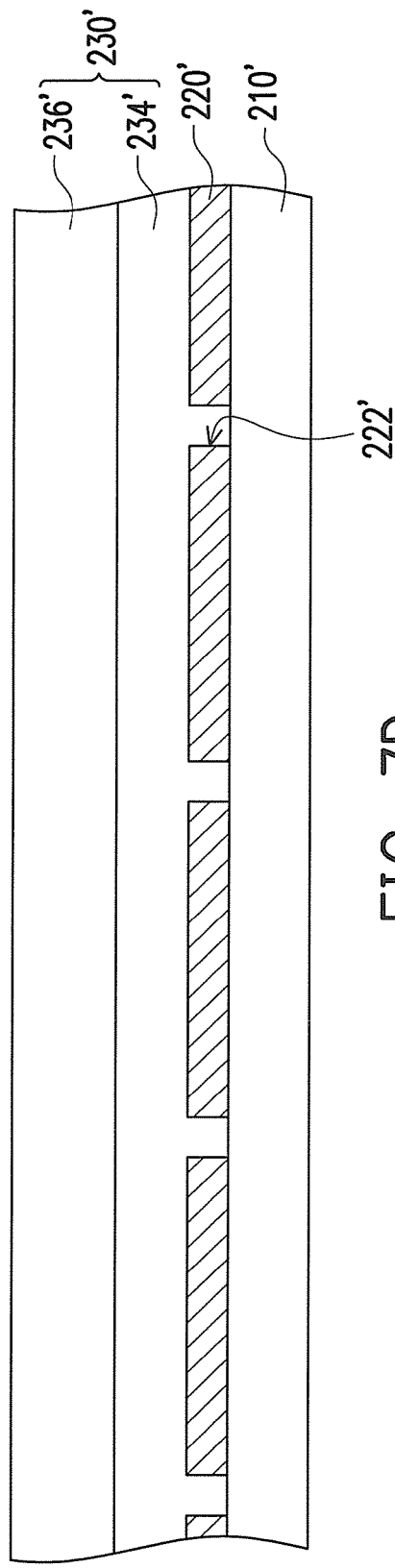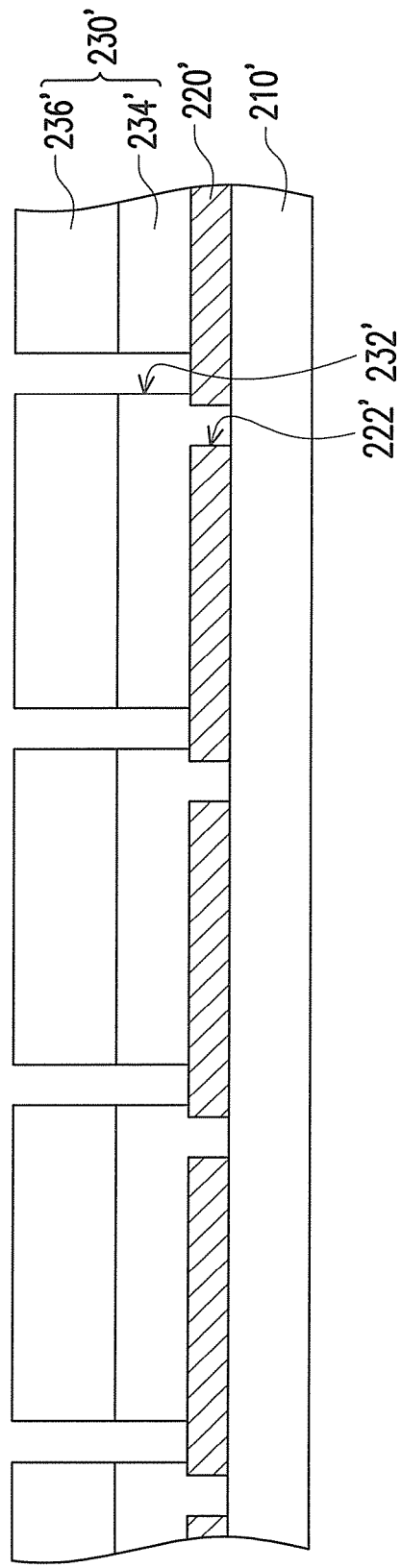
FIG. 7D
FIG. 7E

THIN FILM SOLAR CELL AND MANUFACTURING METHOD THEREOF

CROSS-REFERENCE TO RELATED APPLICATION

This application claims the priority benefits of Taiwan patent application serial no. 98125100, filed on Jul. 24, 2009, Taiwan application serial no. 98139575, filed on Nov. 20, 2009, Taiwan application serial no. 98143398, filed on Dec. 17, 2009, Taiwan application serial no. 98143392, filed on Dec. 17, 2009 and Taiwan application serial no. 98143393, filed on Dec. 17, 2009. The entirety of each of the above-mentioned patent applications is hereby incorporated by reference herein and made a part of specification.

BACKGROUND OF THE INVENTION

1. Field of Invention

The present invention relates to a thin film solar cell and a manufacturing method thereof, and more generally to a thin film solar cell having a passivation layer and a manufacturing method thereof.

2. Description of Related Art

With the raise of the consciousness of environmental protection, the concept of energy saving and carbon dioxide reduction has gradually drawn attention, and the development and utilization of renewable energy have become the focus in the world. A solar cell which converts solar light into electricity is the most promising in energy industry nowadays, so that manufacturers devote themselves to the manufacturing of the solar cell. Currently, the key issue of the solar cell is the improvement of the photoelectric conversion efficiency thereof. Therefore, to improve the photoelectric conversion efficiency of the solar cell means enhancing the product competitiveness.

FIG. 1 schematically illustrates a cross-sectional view of a conventional thin film solar cell. A thin film solar cell 100 includes a substrate 110, a first conductive layer 120, a photoelectric layer 130 and a second conductive layer 140. The thin film solar cell 100 has a plurality of photovoltaic elements 102 connected in series. The photoelectric conversion layer 130 is a photoelectric conversion structure having a PIN junction.

For example, when a light L enters the thin film solar cell 100 from outside, electron-hole pairs are generated in the photoelectric conversion layer 130 by the solar energy, and the internal electric field formed by the PIN junction makes electrons and holes respectively move toward the first conductive layer 120 and the second conductive layer 140, so as to generate a storage state of electricity. Meanwhile, if a load circuit or an electronic device is connected, the electricity can be provided to drive the circuit or device.

However, in the thin film solar cell 100, the surface recombination of the electron-hole pairs easily occurs near the interface S between the second conductive layer 140 and the photoelectric conversion layer 130, and thus, the photoelectric conversion efficiency of the thin film solar cell 100 is affected.

SUMMARY OF THE INVENTION

The present invention provides a thin film solar cell, in which the recombination of electron-hole pairs on the surface is reduced, so that a higher photoelectric conversion efficiency is achieved.

The present invention further provides a thin film solar cell, in which the short circuit current (Isc) is effectively increased and the leakage current is reduced, so that the photoelectric conversion efficiency and electric performance are improved.

The present invention also provides a thin film solar cell having a better photoelectric conversion characteristics.

The present invention provides a manufacturing method to form the above-mentioned thin film solar cell.

The present invention provides a thin film solar cell including a substrate, a first conductive layer, a photoelectric conversion layer, a second conductive layer and a passivation layer. The first conductive layer disposed on the substrate has a plurality of first openings, so as to divide the first conductive layer into bottom electrodes of a plurality photovoltaic elements. The photoelectric conversion layer is disposed on the first conductive layer and has a plurality of second openings to expose a portion of the first conductive layer. The second conductive layer is disposed on the photoelectric conversion layer and connected to the first conductive layer through the second openings, wherein the second conductive layer has a plurality of third openings to expose a portion of the first conductive layer. The passivation layer is disposed on a sidewall of each second opening and between the photoelectric conversion layer and the second conductive layer, so that the second conductive layer in the second openings is electrically isolated from the photoelectric conversion layer.

The present invention provides a manufacturing method of a thin film solar cell. A substrate is provided. A first conductive layer is formed on the substrate. A plurality of first openings are formed in the first conductive layer, so that the first conductive layer is divided to bottom electrodes of a plurality of photovoltaic elements. A photoelectric conversion layer is formed on the first conductive layer. A plurality of second openings are formed in the photoelectric conversion layer to expose a portion of the first conductive layer. A passivation layer is formed on sidewalls of the second openings. A second conductive layer is formed on the photoelectric conversion layer, wherein the second conductive layer is connected to the first conductive layer through the second openings, and the second conductive layer has a plurality of third openings to expose a portion of the first conductive layer. The passivation layer is disposed between the photoelectric conversion layer and the second conductive layer, so that the second conductive layer in the second openings is electrically isolated from the photoelectric conversion layer.

The present invention further provides a thin film solar cell including a substrate, a first conductive layer, a photoelectric conversion layer, a second conductive layer and a blocking material. The first conductive layer disposed on the substrate has a plurality of first openings to expose a portion of the substrate. The photoelectric conversion layer disposed on the first conductive layer has a plurality of second openings to expose a portion of the first conductive layer, wherein the photoelectric conversion layer is physically connected to the substrate through the first openings. The second conductive layer disposed on the photoelectric conversion layer has a plurality of third openings to expose a portion of the first conductive layer and a portion of a side surface of the photoelectric conversion layer. The third openings and a portion of the second openings are disposed at the same positions, and the second conductive layer is physically connected to the first conductive layer through the second openings. The blocking material fills in the third openings, and at least covers the first conductive layer and the side surface of the photoelectric conversion layer which are exposed by the third openings.

The present invention further provides a manufacturing method of a solar cell. A substrate is provided. A first conductive layer is formed on the substrate. A plurality of first openings are formed in the first conductive layer to expose a portion of the substrate. A photoelectric conversion layer is formed on the first conductive layer. A plurality of second openings are formed in the photoelectric conversion layer to expose a portion of the first conductive layer, wherein the photoelectric conversion layer is physically connected to the substrate through the first openings. A second conductive layer is formed on the photoelectric conversion layer. A plurality of third openings are formed in the second conductive layer to expose a portion of the first conductive layer and a portion of a side surface of the photoelectric conversion layer, wherein the second conductive layer is physically connected to the first conductive layer through the second openings. A blocking material fills in the third openings, wherein the blocking material at least covers the first conductive layer and the side surface of the photoelectric layer which are exposed by the third openings.

The present invention also provides a thin film solar cell including a substrate, a first conductive layer, a photovoltaic layer, a second conductive layer and a passivation layer. The first conductive layer disposed on the substrate has a plurality of first openings to expose the substrate. The photovoltaic layer disposed on the first conductive layer has a plurality of second openings to expose the first conductive layer. The second conductive layer is disposed on the photovoltaic layer and electrically connected to the first conductive layer through the second openings, and has a plurality of third openings to expose the first conductive layer and a sidewall of the photovoltaic layer. The passivation layer covers the second conductive layer and the sidewall of the photoelectric conversion layer in the third openings.

The present invention also provides a manufacturing method of a solar cell. A substrate is provided. A first conductive layer is formed on the substrate. The first conductive layer is patterned to form a plurality of first openings to expose the substrate. A photovoltaic layer is formed on the first conductive layer. The photovoltaic layer is patterned to form a plurality of second openings to expose the first conductive layer. A second conductive layer is formed on the photovoltaic layer, wherein the second conductive layer is electrically connected to the first conductive layer through the second openings. The second conductive layer and the photovoltaic layer are patterned to form a plurality of third openings to expose the first conductive layer and a sidewall of the photovoltaic layer. A passivation layer is formed to cover the second conductive layer and the sidewall of the photoelectric conversion layer in the third openings.

In view of the above, the thin film solar cell of the present invention has the passivation layer disposed between the photoelectric conversion layer and the second conductive layer, so that the second conductive layer in the second openings is electrically isolated from the photoelectric conversion layer. Accordingly, the possibility of the surface recombination of electron-hole pairs near the interface between the photoelectric conversion layer and the second conductive layer is reduced, and the photoelectric conversion efficiency of the thin film solar cell is further improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4A to 4H schematically illustrate a process flow of manufacturing a thin film solar cell according to an embodiment of the present invention.

FIGS. 7A to 7H schematically illustrate a process flow of manufacturing a thin film solar cell according to an embodiment of the present invention.

DESCRIPTION OF EMBODIMENTS

Figure 1:
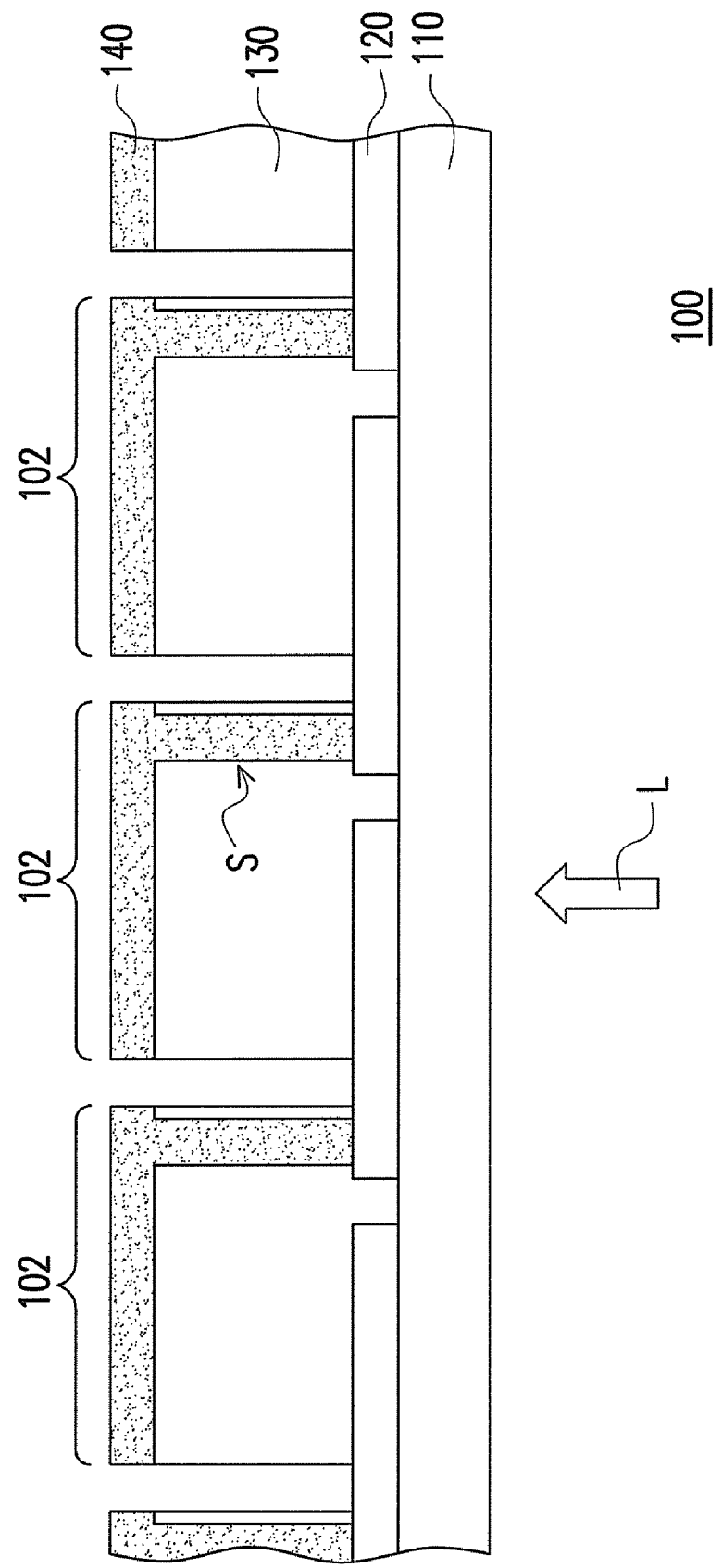
FIG. 1 schematically illustrates a cross-sectional view of a conventional thin film solar cell.

Reference will now be made in detail to the present preferred embodiments of the invention, examples of which are illustrated in the accompanying drawings. Wherever possible, the same reference numbers are used in the drawings and the description to refer to the same or like parts.

First Embodiment

Figure 2:
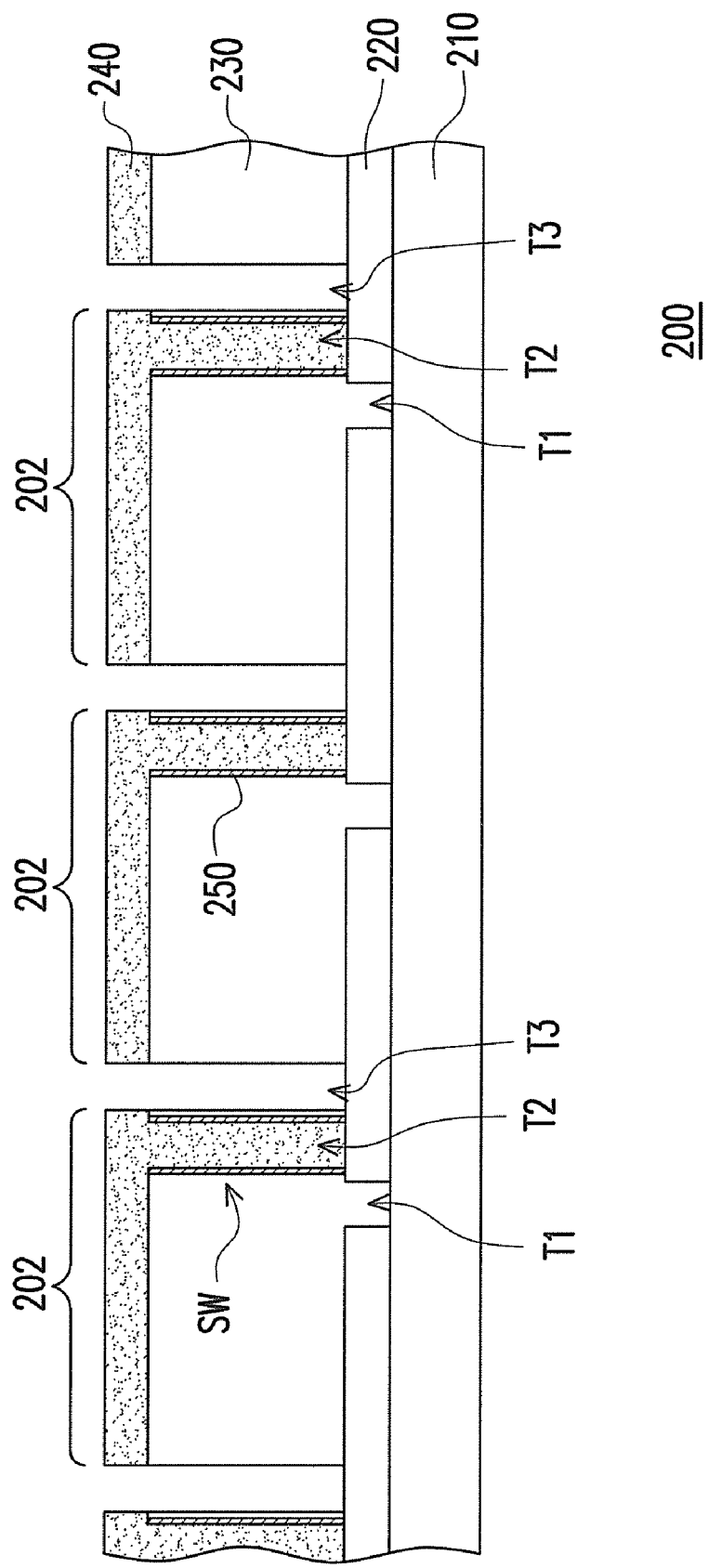
FIG. 2 schematically illustrates a local cross-sectional view of a thin film solar cell according to an embodiment of the present invention.

FIG. 2 schematically illustrates a local cross-sectional view of a thin film solar cell according to an embodiment of the present invention. Referring to FIG. 2, a thin film solar cell 200 includes a substrate 210, a first conductive layer 220, a photoelectric conversion layer 230, a second conductive layer 240 and a passivation layer 250. In this embodiment, the substrate 210 can be a transparent substrate, such as a glass substrate.

The first conductive layer 220 is disposed on the substrate 210 and has a plurality of first openings T1, and thus, the first conductive layer 220 is divided into bottom electrodes of a plurality of photovoltaic elements 202. In this embodiment, the first conductive layer 220 can be a transparent conductive layer, and the material thereof can be at least one of indium tin oxide (ITO), indium zinc oxide (IZO), indium tin zinc oxide (ITZO), zinc oxide, aluminium tin oxide (ATO), aluminium zinc oxide (AZO), cadmium indium oxide (CIO), cadmium zinc oxide (CZO), gallium zinc oxide (GZO) and fluorine tin oxide (FTO).

In another embodiment (not shown), the first conductive layer 220 can be a stacked layer of a reflective layer (not shown) and the above-mentioned transparent conductive layer, and the reflective layer is disposed between the transparent conductive layer and the substrate 210. The material of the reflective layer can be a metal with higher reflectivity, such as aluminium (Al), silver (Ag), molybdenum (Mo) or copper (Cu). In addition, the area and number of the photovoltaic elements 202 in the thin film solar cell 200 are not limited by the present invention.

The photoelectric conversion layer 230 is disposed on the first conductive layer 220, and has a plurality of second openings T2 to respectively expose a portion of the first conductive layer 220, as shown in FIG. 2. In this embodiment, the thin film solar cell 200 is a thin film solar cell having a single-layer photoelectric conversion layer. However, the present invention is not limited thereto. In another embodiment, the thin film solar cell 200 can be an amorphous silicon thin film solar cell, a microcrystalline silicon thin film solar cell, a tandem thin film solar cell or a triple thin film solar cell.

Figure 3A:
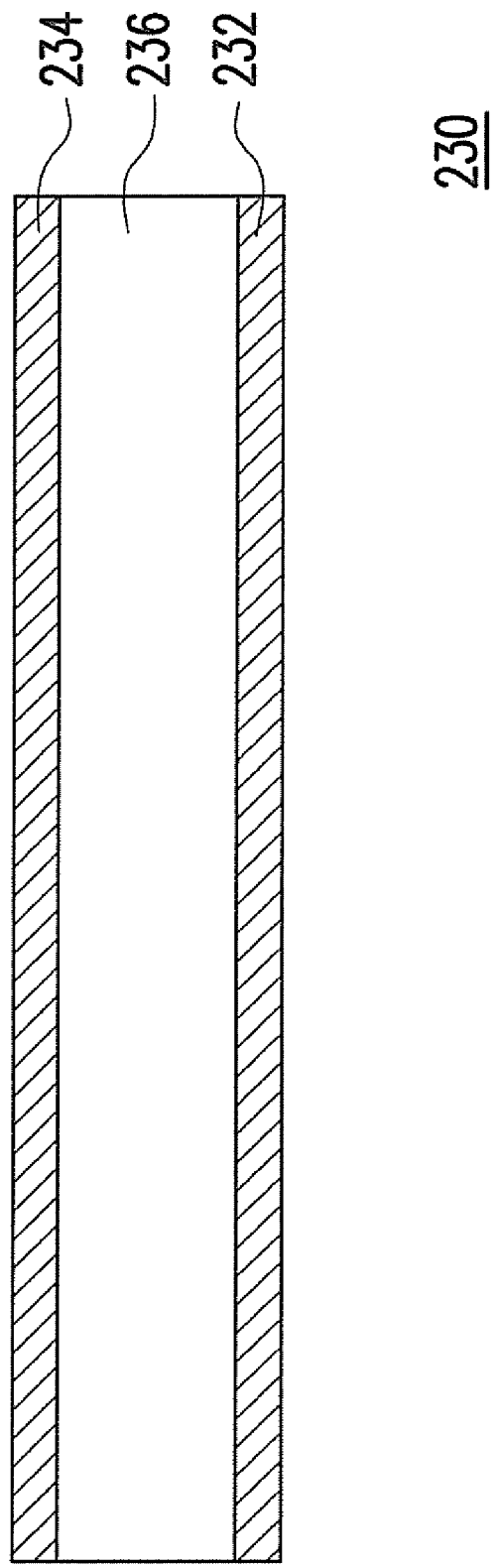
FIG. 3A schematically illustrates a local cross-sectional view of a photoelectric conversion layer of a thin film solar cell according to an embodiment of the present invention.

FIG. 3A schematically illustrates a local cross-sectional view of a photoelectric conversion layer of a thin film solar cell according to an embodiment of the present invention. Referring to FIG. 2 and FIG. 3A, in details, the above-mentioned photoelectric conversion layer 230 has a first-type semiconductor layer 232, an intrinsic layer 236 and a second-type semiconductor layer 234, for example. The first-type semiconductor layer 232 can be a P-type semiconductor layer, while the second-type semiconductor layer 234 can be an N-type semiconductor layer. In other words, in this embodiment, the photoelectric conversion layer 230 is a PIN photoelectric structure. In some embodiments, the photoelectric conversion layer 230 can be a PN photoelectric structure without the intrinsic layer 236. In another embodiment, the first-type semiconductor layer 232 can be an N-type semiconductor layer, while the second-type semiconductor layer 234 can be a P-type semiconductor layer.

Figure 3B:
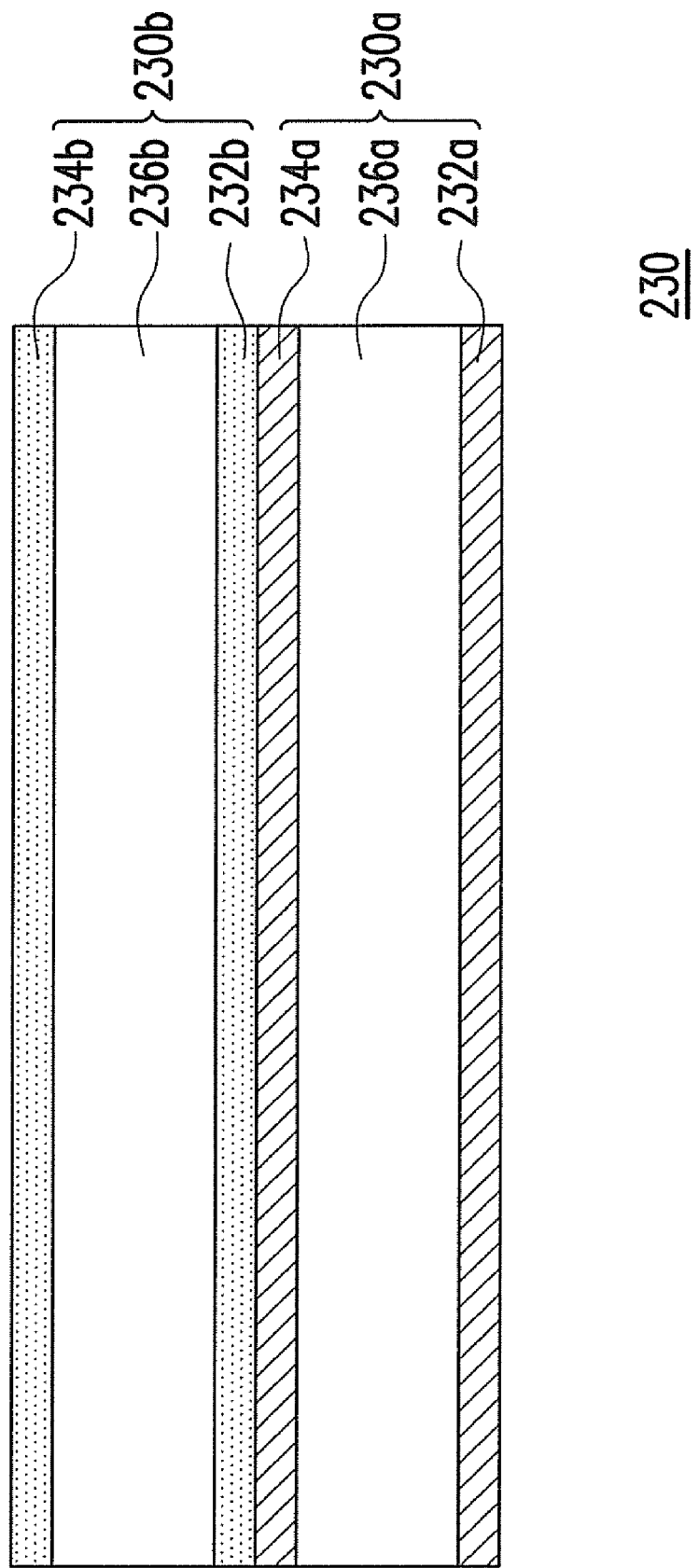
FIG. 3B schematically illustrates a local cross-sectional view of a photoelectric conversion layer of a thin film solar cell according to another embodiment of the present invention.

FIG. 3B schematically illustrates a local cross-sectional view of a photoelectric conversion layer of a thin film solar cell according to an embodiment of the present invention. Referring to FIG. 2 and FIG. 3B, the above-mentioned photoelectric conversion layer 230 can be a double-layer photoelectric conversion layer as shown in FIG. 3B, wherein the photoelectric conversion layer 230 includes a first photoelectric conversion layer 230a and a second photoelectric conversion layer 230b. In the embodiment as shown in FIG. 3B, the first photoelectric conversion layer 230a has a first-type semiconductor layer 232a, a first intrinsic layer 236a and a second-type semiconductor layer 234a, for example. The first-type semiconductor layer 232a is a P-type semiconductor layer, while the second-type semiconductor layer 234a is an N-type semiconductor layer. In another embodiment, the first photoelectric layer 230a can be a PN semiconductor stacked structure without the first intrinsic layer 236a.

Similarly, the second photoelectric conversion layer 230b has a first-type semiconductor layer 232b, a second intrinsic layer 236b and a second-type semiconductor layer 234b, for example. The first-type semiconductor layer 232a is a P-type semiconductor layer, while the second-type semiconductor layer 234a is an N-type semiconductor layer. Similarly, the second photoelectric conversion layer 230b is also a PIN semiconductor stacked structure. However, in another embodiment, the second photoelectric conversion layer 230b can also be a PN semiconductor stacked structure without the second intrinsic layer 236a.

In another embodiment, the first-type semiconductor layer 232a of the first photoelectric conversion layer 230a and the first-type semiconductor layer 232b of the second photoelectric conversion layer 230b can be N-type semiconductor layers, while the second-type semiconductor layer 234a of the first photoelectric conversion layer 230a and the second-type semiconductor layer 234b of the second photoelectric conversion layer 230b can be P-type semiconductor layers.

The photoelectric conversion layer 230 of the above-mentioned embodiment is provided only for illustration purposes, and is not construed as limiting the stacked number or structure of the photoelectric conversion layer 230. Persons skilled in the art can adjust the stacked number or structure of the photoelectric conversion layer 230 upon the requirements.

In the above-mentioned embodiment, the photoelectric conversion layer 230 can be a semiconductor thin film including carbon, silicon or germanium in Group VI of the Periodic Table. For example, the photoelectric conversion layer 230 includes at least one of a silicon thin film, a carbon thin film, a germanium thin film, a silicon carbide thin film and a silicon germanium thin film, each of which may be in monocrystalline form, polycrystalline form, amorphous form or microcrystalline form, or a combination thereof. Further, in addition to the silicon thin film, examples of the material of the photoelectric conversion layer 230 can be copper indium gallium diselenide (CIGS), cadmium telluride (CdTe) or a combination thereof. Accordingly, the thin film solar cell 200 of this embodiment can be a CIGS solar cell or a CdTe solar cell.

Besides, in some embodiments, the material of the photoelectric conversion layer 230 can be a III-V compound semiconductor thin film, a II-VI compound semiconductor thin film, an organic compound semiconductor thin film or a combination thereof. For example, the III-V compound semiconductor thin film includes at least one of a gallium arsenide (GaAs) thin film and an indium gallium phosphide (InGaP) thin film, or a combination thereof. The II-VI compound semiconductor thin film includes at least one of a copper indium diselenide (CIS) thin film, a copper indium gallium diselenide (CIGS) thin film and a cadmium telluride (CdTe) thin film, or a combination thereof. The organic compound semiconductor thin film includes a mixture of a conjugated polymer donor and PCBM.

Referring to FIG. 2, the second conductive layer 240 is disposed on the photoelectric conversion layer 230 and electrically connected to the first conductive layer 220 through the second openings T2. The second conductive layer 240 has a plurality of third openings T3 to expose a portion of the first conductive layer 220.

In this embodiment, the second conductive layer 240 can include the material of the above-mentioned transparent conductive layer, and the details are not iterated herein. In this embodiment, the second conductive layer 240 can further include a reflective layer disposed on the transparent conductive layer. It is noted that when the second conductive layer 240 includes a reflective layer, the first conductive layer 220 can only be a transparent conductive layer. On the contrary, when the first conductive layer 220 includes a reflective layer, the second conductive layer 240 can only be a transparent conductive layer without a reflective layer thereon. In an embodiment, each of the first conductive layer 220 and the second conductive layer 250 can be a single transparent conductive layer without a reflective layer thereon. In other words, the design of the first conductive layer 220 and the second conductive layer 240 can be adjusted according to the users' requirements (e.g. for manufacturing a thin film solar cell with double-sided illumination or a thin film solar cell with one-sided illumination). The design of the first conductive layer 220 and the second conductive layer 240 described above is provided only for illustration purposes, and is not construed as limiting the present invention.

Particularly, the thin film solar cell 200 has the passivation layer 250. The passivation layer 250 is disposed on the sidewall SW of each second opening T2 and between the photoelectric conversion layer 230 and the second conductive layer 240, so that the second conductive layer 240 in the second openings T2 is electrically isolated from the photoelectric conversion layer 230. In this embodiment, the thickness of the passivation layer 250 is substantially between 0.1 nm and 10 nm. In some embodiments, the thickness of the passivation layer 250 is substantially between 1 nm and 5 nm. The material of the passivation layer 250 can be a dielectric material, an insulating material or a oxygen-containing compound. Specifically, the material of the passivation layer 250 can be an insulating material such as silicon oxide, silicon nitride, silicon oxynitirde or the like.

The thin film solar cell 200 is irradiated by a light (not shown) to generate electron-hole pairs. The thin film solar cell 200 has the passivation layer 250 in the second openings T2 between the photoelectric conversion layer 230 and the second conductive layer 240, so that the second conductive layer 240 in the second openings T2 is electrically isolated from the photoelectric conversion layer 230, and the recombination of the electron-hole pairs near the sidewall SW of each second opening T2 is further reduced. In other words, as compared with the thin film solar cell 100 without the passivation layer 250, the thin film solar cell 200 can exhibit a higher photoelectric conversion efficiency.

A manufacturing method of the above-mentioned thin film solar cell 200 is described in the following.

Figure 4A:

FIGS. 4A to 4H schematically illustrate a process flow of manufacturing a thin film solar cell according to an embodiment of the present invention. Referring to FIG. 4A, the above-mentioned substrate 210 is provided. The substrate 210 can be a glass substrate.

Figure 4B:
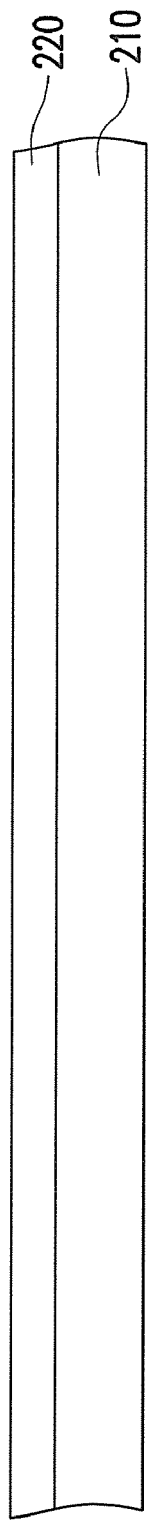

Referring to FIG. 4B, a first conductive layer 220 is formed on the substrate 210. In this embodiment, the first conductive layer 220 includes the material of the above-mentioned transparent conductive layer, and the forming method thereof is by performing a sputtering process, a metal organic chemical vapour deposition (MOCVD) process or an evaporation process, for example.

Figure 4C:
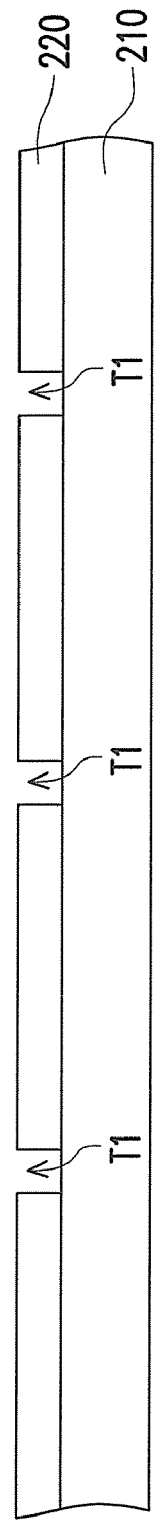

Referring to FIG. 4C, a plurality of first openings T1 are formed in the first conductive layer 220, so that the first conductive layer 220 is divided into bottom electrodes of a plurality of photovoltaic elements. In this embodiment, the method of forming the first openings T1 is by performing a laser process, an etching process or a removing process using mechanical force, for example.

Referring to FIG. 4D, the above-mentioned photoelectric conversion layer 230 is formed on first conductive layer 220. In this embodiment, the method of forming the photoelectric conversion layer 230 is by performing a radio frequency plasma enhanced chemical vapour deposition (RF PECVD) process, a vary high frequency plasma enhanced chemical vapour deposition (VHF CVD) process or a microwave plasma enhanced chemical vapour deposition (MW PECVD) process, for example. Further, the deposition thicknesses of the photoelectric conversion layer 230 can be decided according to the users' requirements.

Thereafter, a plurality of second openings T2 are formed in the photoelectric conversion layer 230 to expose a portion of the first conductive layer 220, as shown in FIG. 4E. In this embodiment, the method of forming the second openings T2 is by performing a laser process, an etching process or a removing process using mechanical force, for example.

Afterwards, a passivation layer 250 is formed on the sidewall SW of each second opening T2, as shown in FIG. 4F. In this embodiment, the method of forming the passivation layer 250 is by oxidizing the photoelectric conversion layer 230 at the sidewall SW of each second opening T2 with a $CO_2$ plasma treatment P, so as to form the above-mentioned passivation layer 250. In this embodiment, the thickness of the passivation layer 250 can be adjusted by changing the process parameters of the $CO_2$ plasma treatment P, such as time, gas pressure, output power, etc. In this embodiment, the thickness of the passivation layer 250 is substantially between 0.1 nm and 10 nm. In some embodiments, the thickness of the passivation layer 250 is substantially between 1 nm and 5 nm. Further, in some embodiments, the passivation layer 250 can be a native oxide layer of the photoelectric conversion layer 230.

In details, before the step of FIG. 4F is performed, a thinner oxide layer is formed on the top of the photoelectric conversion layer 230; thus, during the step of forming the $CO_2$ plasma treatment P, excess oxide is not easily formed on the top of the photoelectric conversion layer 230 to increase the series resistance between the photoelectric elements 202. In another embodiment, a polishing or like process can be formed, after the $CO_2$ plasma treatment P, to reduce the thickness of the oxide layer on the top of the photoelectric conversion layer 230. The above-mentioned methods of forming the passivation layer 250 are provided only for illustration purposes, and are not construed as limiting the present invention. In yet another embodiment, the passivation layer 250 having the above-mentioned material can be formed on the sidewall SW through a suitable process.

Thereafter, the above-mentioned second conductive layer 240 is formed on the photoelectric conversion layer 230, wherein the second conductive layer 240 is electrically connected to the first conductive layer 220 through the second openings T2, as shown in FIG. 4G. The second conductive layer 240 usually serves as top electrodes of the plurality of photoelectric elements 202. In this embodiment, the method of forming the second conductive layer 240 is by performing the above-mentioned sputtering process, MOCVD process, or evaporation process, for example. The material of the second conductive layer 240 is the material of the above-mentioned transparent conductive layer, and the details are not iterated herein.

Figure 4H:
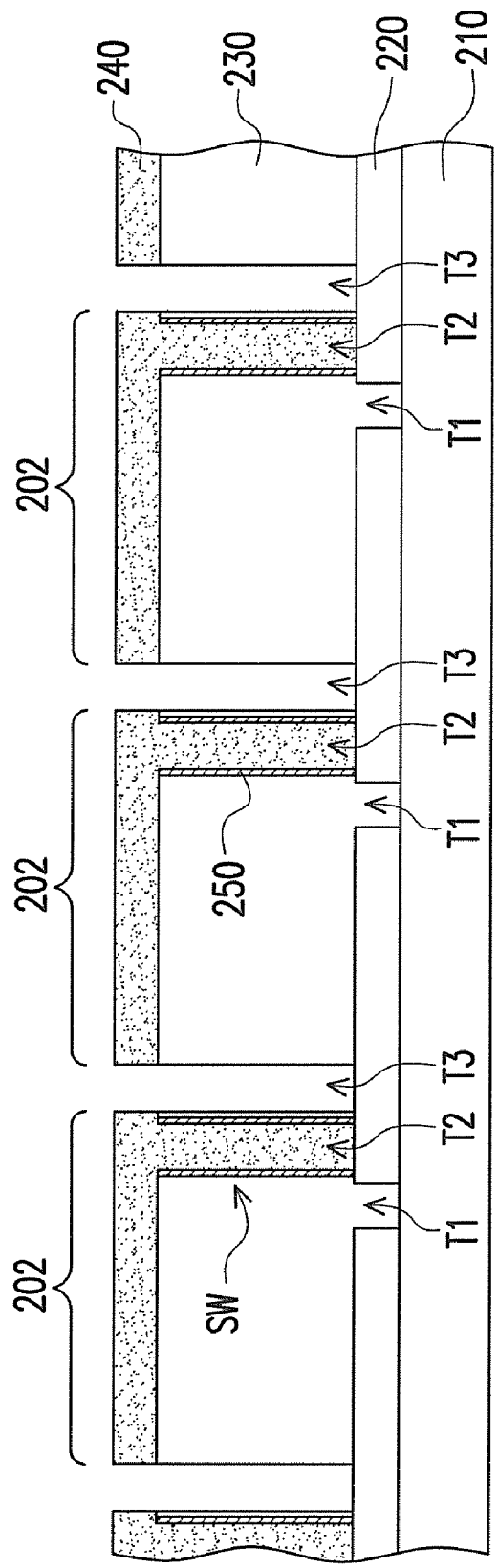

Afterwards, the step of FIG. 4H can be optionally performed. Referring to FIG. 4H, a laser process, an etching process or a removing process using mechanical force is used to simultaneously form a plurality of third openings T3 to expose a portion of the first conductive layer 220. The manufacturing process of the thin film solar cell 200 as shown in FIG. 2 is thus completed.

It is noted that in one case, the second conductive layer 240 is a stacked structure of a transparent conductive layer and a reflective layer, and the first conductive layer 220 is a transparent conductive layer. Herein, a transparent conductive layer is formed on the photoelectric conversion layer 230, and a reflective layer is then formed on the transparent conductive layer. Thereafter, the process step in FIG. 4H is performed so as to form a thin film solar cell with one-sided illumination.

In another case, the first conductive layer 220 can be a stacked structure of a transparent conductive layer and a reflective layer, so as to form another thin film solar cell with one-sided illumination. The manufacturing method has been described above, and the details are not iterated herein. Herein, it is noted that the second conductive layer 240 can only be a transparent conductive layer.

Second Embodiment

Figure 5:
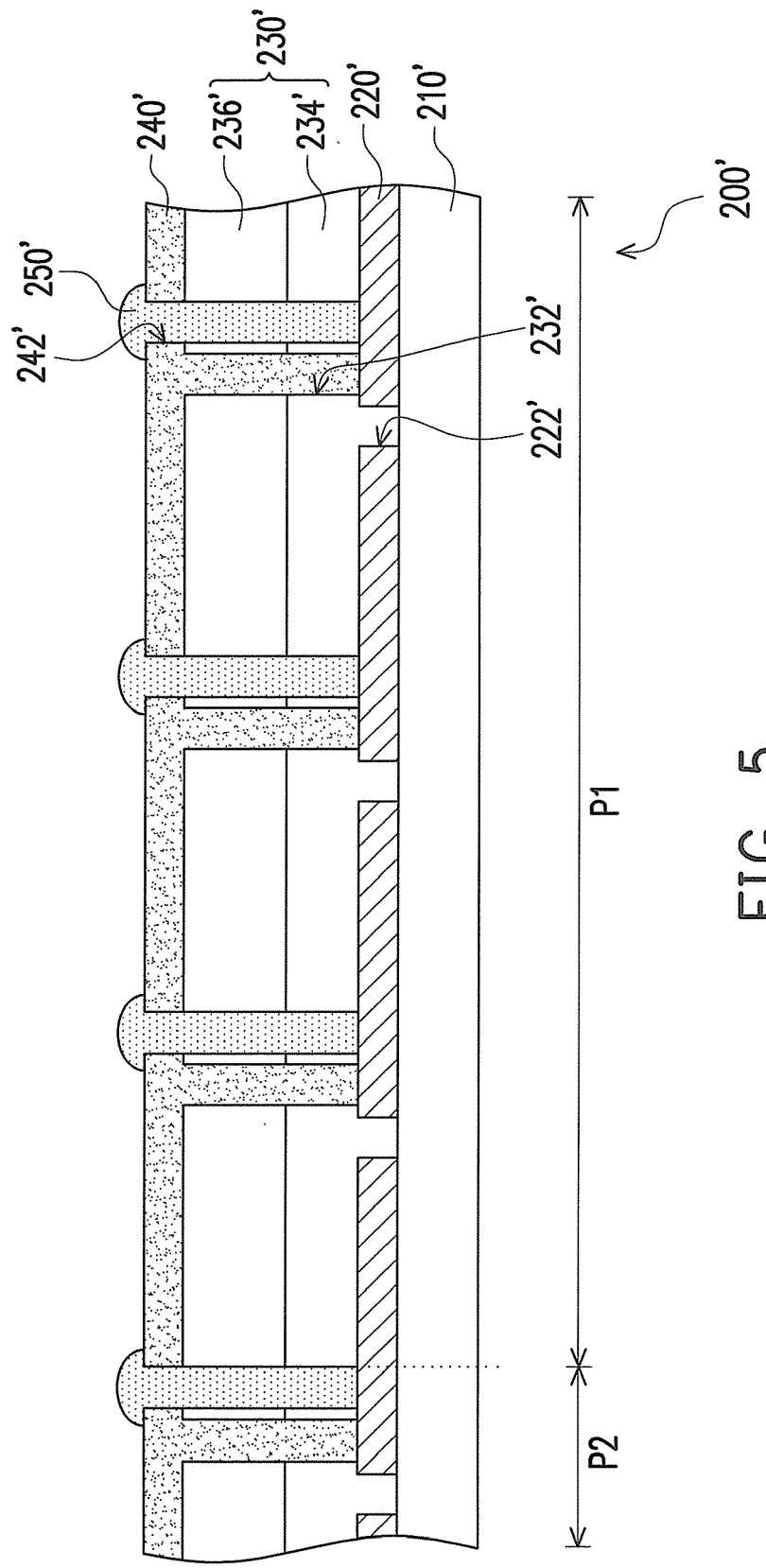
FIG. 5 schematically illustrates a local cross-sectional view of a thin film solar cell according to another embodiment of the present invention.

FIG. 5 schematically illustrates a local cross-sectional view of a thin film solar cell according to another embodiment of the present invention. Referring to FIG. 5, in this embodiment, a thin film solar cell 200' includes a substrate 210', a first conductive layer 220', a photoelectric conversion layer 230', a second conductive layer 240' and a blocking material 250'. In this embodiment, the substrate 210' can be a transparent substrate, such as a glass substrate.

The first conductive layer 220' is disposed on the substrate 210', and has a plurality of first openings 222' to expose a portion of the substrate 210'. The first conductive layer 220' usually serves as front electrodes of a plurality of sub cells connected in series. In this embodiment, the first conductive layer 220' can include the material of the above-mentioned first conductive layer 220, and the details are not iterated herein. Similarly, the first conductive layer 220' can be a stacked layer of a reflective layer (not shown) and the above-mentioned transparent conductive layer, and the reflective layer is disposed between the transparent conductive layer and the substrate 210'. The material of the reflective layer can be a metal with higher reflectivity, such as silver (Ag) or aluminium (Al).

The photoelectric conversion layer 230' is disposed on the first conductive layer 220', and has a plurality of second openings 232' to expose a portion of the first conductive layer 220'. The photoelectric conversion layer 230' is physically connected to the substrate 210' through the first openings 222'. In this embodiment, the photoelectric conversion layer 230' can include the described structure or possible implantation of the above-mentioned photoelectric conversion layer 230, and the details are not iterated herein.

That is, the thin film solar cell 200' can at least include the film layer structure of an amorphous silicon thin film solar cell, a microcrystalline silicon thin film solar cell, a tandem thin film solar cell, a triple thin film solar cell, a CIS thin film solar cell, a CIGS thin film solar cell, a GdTe thin film solar cell or an organic thin film solar cell. In other words, the photoelectric conversion layer 230' of this embodiment is provided only for illustration purposes, and can be decided according to the users' requirements. The photoelectric conversion layer 230' can also include the film layer structure of another suitable thin film solar cell.

Figure 6:
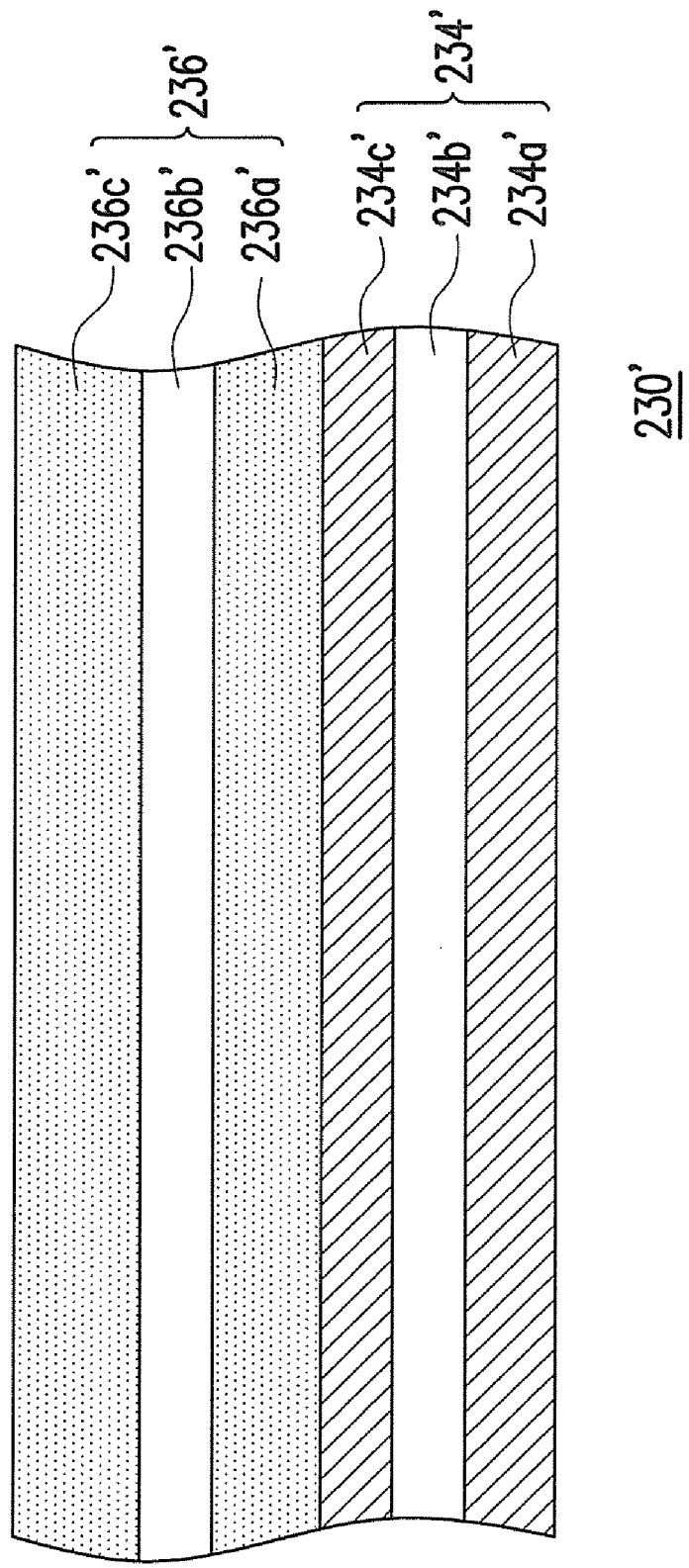
FIG. 6 schematically illustrates film layers of a photoelectric conversion layer of a thin film solar cell.

Referring to FIG. 6, when a tandem thin film solar cell is taken as an example, the photoelectric conversion layer 230' can be a stacked layer of a first semiconductor stacked layer 234' and a second semiconductor stacked layer 236'. The first semiconductor stacked layer 234' has a first-type semiconductor layer 234a', a first intrinsic layer 234b' and a second-type semiconductor layer 234c', for example. The second semiconductor stacked layer 236' has a third-type semiconductor layer 236a', a second intrinsic layer 236b' and a fourth-type semiconductor layer 236c', for example. The first-type semiconductor layer 234a' of the first semiconductor stacked layer 234' and the third-type semiconductor layer 236a' of the second semiconductor stacked layer 236' can be P-type semiconductor layers, while the second-type semiconductor layer 234c' of the first semiconductor stacked layer 234' and the fourth-type semiconductor layer 236c' of the second semiconductor stacked layer 236' can be N-type semiconductor layers. In other words, in this embodiment, the first semiconductor stacked layer 234' and the second semiconductor stacked layer 236' form a PIN semiconductor stacked structure. However, the present invention is not limited thereto.

In another embodiment, the first-type semiconductor layer 234a' of the first semiconductor stacked layer 234' and the third-type semiconductor layer 236a' of the second semiconductor stacked layer 236' can be N-type semiconductor layers, while the second-type semiconductor layer 234c' of the first semiconductor stacked layer 234' and the fourth-type semiconductor layer 236c' of the second semiconductor stacked layer 236' can be P-type semiconductor layers. In addition, in another embodiment, the first semiconductor stacked layer 234' and the second semiconductor stacked layer 236' described above do not have the first intrinsic layer 234b' and the second intrinsic layer 236b' and form a PN semiconductor stacked structure.

Referring to FIG. 5 again, the second conductive layer 240' is disposed on the photoelectric conversion layer 230', and has a plurality of third openings 242' to expose a portion of the first conductive layer 220' and a portion of the side surface of the photoelectric conversion layer 230'. The third openings 242' and a portion of the second openings 232' are disposed at the same positions, and the second conductive layer 240' is physically connected to the first conductive layer 220' through the second openings 232'. In this embodiment, the thin film solar cell 200' is divided into a photoelectric conversion region P1 and an isolation region P2 by the third openings 242', as shown in FIG. 5. Further, the second conductive layer 240' can include the material of the above-mentioned transparent conductive layer, and the details are not iterated herein. In this embodiment, the second conductive layer 240' can further include a reflective layer disposed on the transparent conductive layer.

It is noted that when the second conductive layer 240' includes a reflective layer, the first conductive layer 220' can only be a transparent conductive layer. On the contrary, when the first conductive layer 220' includes a reflective layer, the second conductive layer 240' can only be a transparent conductive layer without a reflective layer thereon. In another embodiment, each of the first conductive layer 220' and the second conductive layer 240' can be a single transparent conductive layer without a reflective layer thereon. In other words, the design of the first conductive layer 220' and the second conductive layer 240' can be adjusted according to the users' requirements (e.g. for manufacturing a thin film solar cell with double-sided illumination or a thin film solar cell with one-sided illumination). The design of the first conductive layer 220' and the second conductive layer 240' described above is provided only for illustration purposes, and is not construed as limiting the present invention.

The blocking material 250' fills in the third openings 242' and at least covers the first conductive layer 220' and the sidewall of the photoelectric conversion layer 230' which are exposed by the third openings 242', as shown in FIG. 5. In this embodiment, the blocking material 250' is mainly for protecting the first conductive layer 220', the sidewall of the photoelectric conversion layer 230', and the sidewall of a portion of the second conductive layer 240' which are exposed by the third openings 242', so that degradation of film layers caused by moisture penetration is avoided and the leakage current possibly generated at the first conductive layer 220' and at the side surface of the photoelectric conversion layer 230' is reduced. Accordingly, the electrical performance of the thin film solar cell 200' is further improved.

In details, when the first conductive layer 220', the photoelectric conversion layer 230' and the second conductive layer 240' in the isolation region P2 are not completely removed or not electrically isolated from the photoelectric conversion region P1, a photo current is generated as the photoelectric conversion layer 230' in the isolation region P2 is illuminated. Similarly, a leakage current may be generated on the first conductive layer 220', on the side surface of the photoelectric conversion layer 230' and on the side surface of the second conductive layer 240' in the isolation region P2. Thus, filling the blocking material in the third openings 242' is beneficial to increase the short circuit current (Isc) and shunt resistance of the thin film solar cell 200'. When the shunt resistance is increased, the leakage current is usually decreased accordingly. Therefore, the photoelectric conversion efficiency of the thin film solar cell 200' is improved, so that the thin film solar cell 200' has a better electrical performance. In this embodiment, the blocking material 250' includes an insulating material, wherein the insulating material includes an inorganic material or an organic material. The inorganic material can be silicon oxide, silicon nitride, silicon oxynitirde, silicon carbide, hafnium oxide, aluminum oxide or a combination thereof, for example. The organic material can be photoresist, benzocyclobutane (BCB), cycloolefin, polyimide, polyamide, polyester, polyalcohols, polyethylene, polyphenylene, resin, polyether, polyketone or a combination thereof, for example.

In brief, the thin film solar cell 200' of this embodiment has the above-mentioned blocking material 250' to cover the first conductive layer 220' and the side surface of the photoelectric conversion layer 230' which are exposed by the third openings 242', so that degradation of film layers caused by moisture penetration is avoided, and the short circuit current (Isc) and shunt resistance are increased to reduce the leakage current possibly generated at the first conductive layer 220' and at the side surface of the photoelectric conversion layer 230'. Accordingly, the electrical performance and photoelectric conversion efficiency of the thin film solar cell 200' are further improved.

In addition, the present invention also provides a manufacturing method of the above-mentioned thin film solar cell 200', which is described in the following.

Figure 7A:

FIGS. 7A to 7H schematically illustrate a process flow of manufacturing a thin film solar cell according to an embodiment of the present invention. Referring to FIG. 7A, the above-mentioned substrate 210' is provided. The substrate 210' can be a transparent substrate, such as a glass substrate.

Figure 7B:
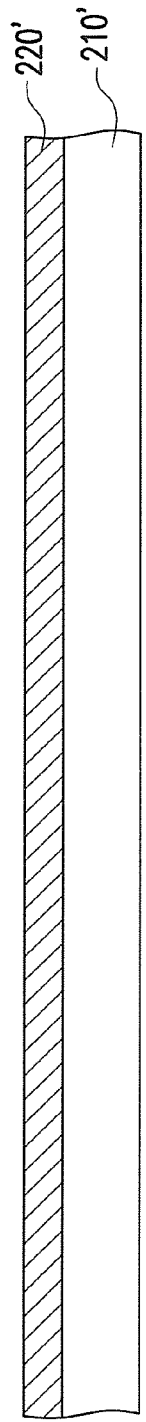

Referring to FIG. 7B, the above-mentioned first conductive layer 220' is formed on the substrate 210'. The first conductive layer 220' includes the material of the above-mentioned transparent conductive layer, and the forming method thereof is by performing a sputtering process, a metal organic chemical vapour deposition (MOCVD) process or an evaporation process, for example.

Figure 7C:
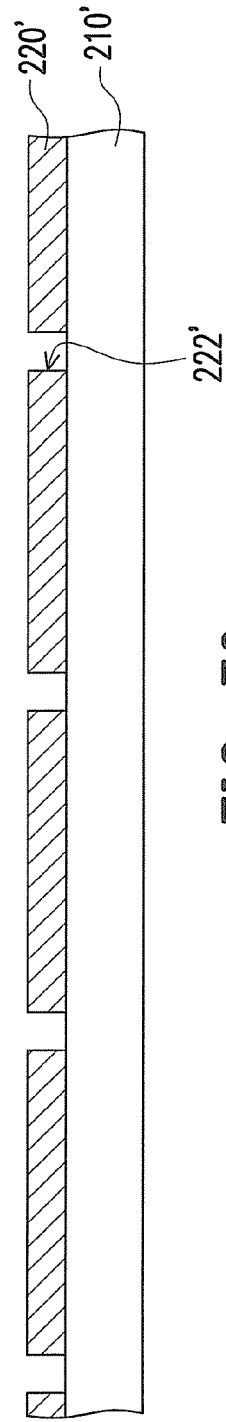

Referring to FIG. 7C, the above-mentioned first openings 222' are formed in the first conductive layer 220' to expose a portion of the substrate 210'. Accordingly, front electrodes of a plurality of sub cells connected in series are formed. In this embodiment, the method of forming the first openings 222' is by patterning the first conductive layer 220' with a laser process, for example.

Referring to FIG. 7D, the above-mentioned photoelectric conversion layer 230' is formed on the first conductive layer 220'. In this embodiment, the method of forming the photoelectric conversion layer 230' includes forming the above-mentioned first semiconductor stacked layer 234' on the first conductive layer 220' and then forming the above-mentioned second semiconductor stacked layer 236' on the first semiconductor stacked layer 234'. In details, the method of forming the photoelectric conversion layer 230' is by performing a radio frequency plasma enhanced chemical vapour deposition (RF PECVD) process, a vary high frequency plasma enhanced chemical vapour deposition (VHF CVD) process or a microwave plasma enhanced chemical vapour deposition (MW PECVD) process, for example. The above-mentioned forming method of the photoelectric conversion layer 230' is provided only for illustration purposes, and is not construed as limiting the present invention. The forming method of the photoelectric conversion layer 230' can be adjusted depending on the film layer design (e.g. the structure of the above-mentioned Group IV thin film or II-VI compound semiconductor thin film) of the photoelectric conversion layer 230'. Further, the deposition thicknesses of the first semiconductor stacked layer 234' and the second semiconductor stacked layer 236' can be decided according to the users' requirements.

Referring to FIG. 7E, the above-mentioned second openings 232' are formed in the photoelectric conversion layer 230' to expose a portion of the first conductive layer 220'. The first semiconductor stacked layer 232' of the photoelectric conversion layer 230' is physically connected to the substrate 210' through the first openings 222'. In this embodiment, the method of forming the second openings 232' is by patterning the photoelectric conversion layer 230' with a laser process, for example.

Figure 7F:
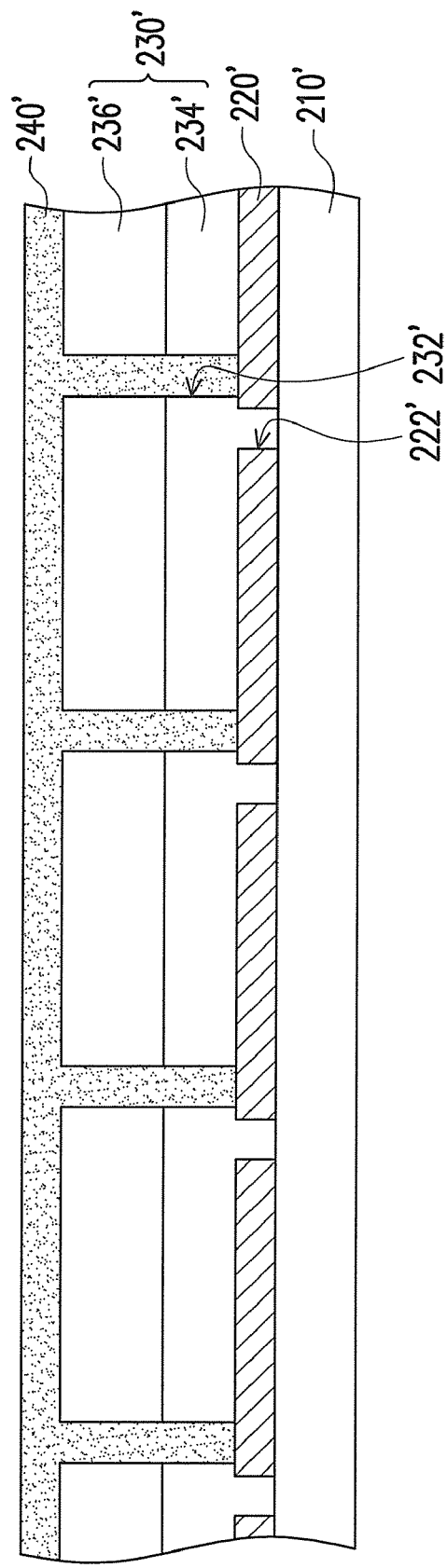

Referring to FIG. 7F, the above-mentioned second conductive layer 240' is formed on the photoelectric conversion layer 230'. In this embodiment, the second conductive layer 240' and the first conductive layer 220' have the same forming method. That is, the method of forming the second conductive layer 240' is by performing the above-mentioned sputtering process, MOCVD process, or evaporation process, for example. The material of the second conductive layer 240' is the material of the above-mentioned transparent conductive layer, and the details are not iterated herein.

Figure 7G:
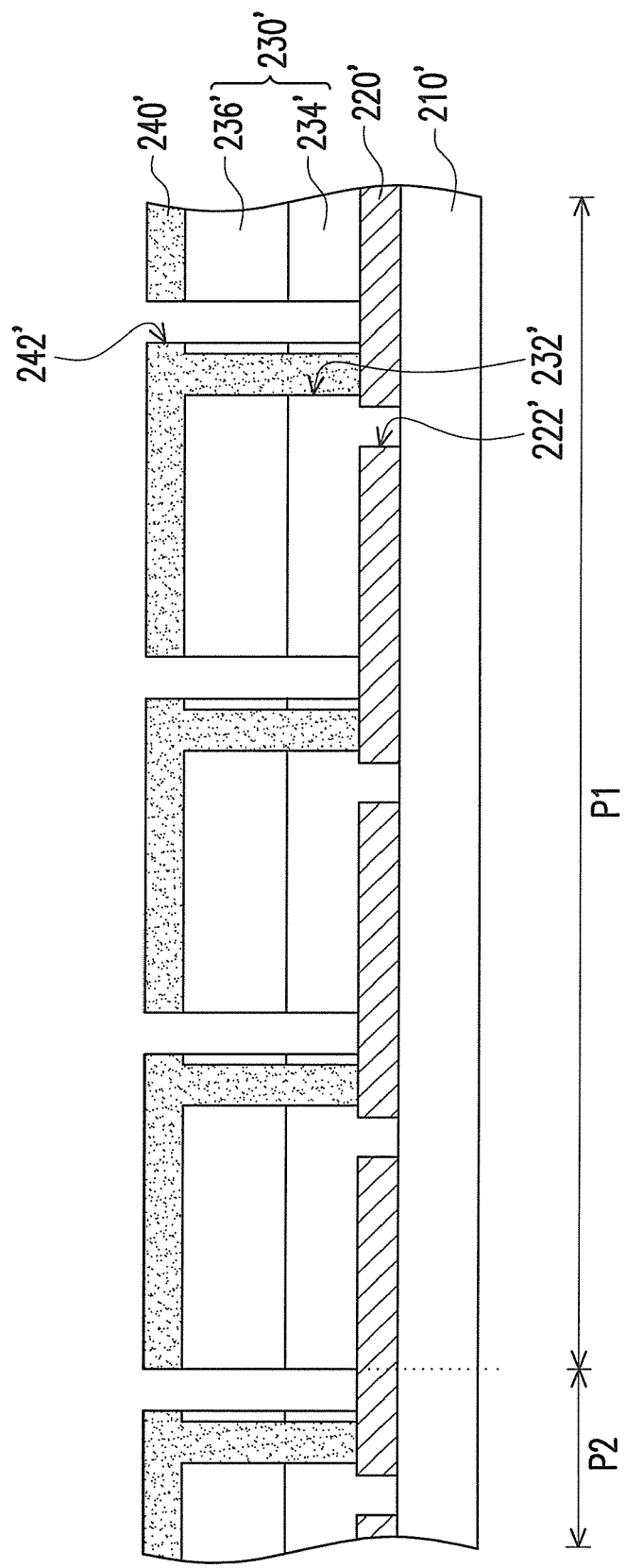

Referring to FIG. 7G, the above-mentioned third openings 242' are formed in the second conductive layer 240' to expose a portion of the first conductive layer 220' and a portion of the side surface of the photoelectric conversion layer 230'. The second conductive layer 240' is physically connected to the first conductive layer 220' through the second openings 232'. In this embodiment, the method of forming the third openings 242' is by patterning the second conductive layer 240' with a laser process, for example. Accordingly, back electrodes of the plurality of sub cells connected in series are formed. In this embodiment, after the step of forming the third openings 242', the thin film solar cell 200' is divided to a photoelectric conversion region P1 and an isolation region P2, as shown in FIG. 7G.

Figure 7H:
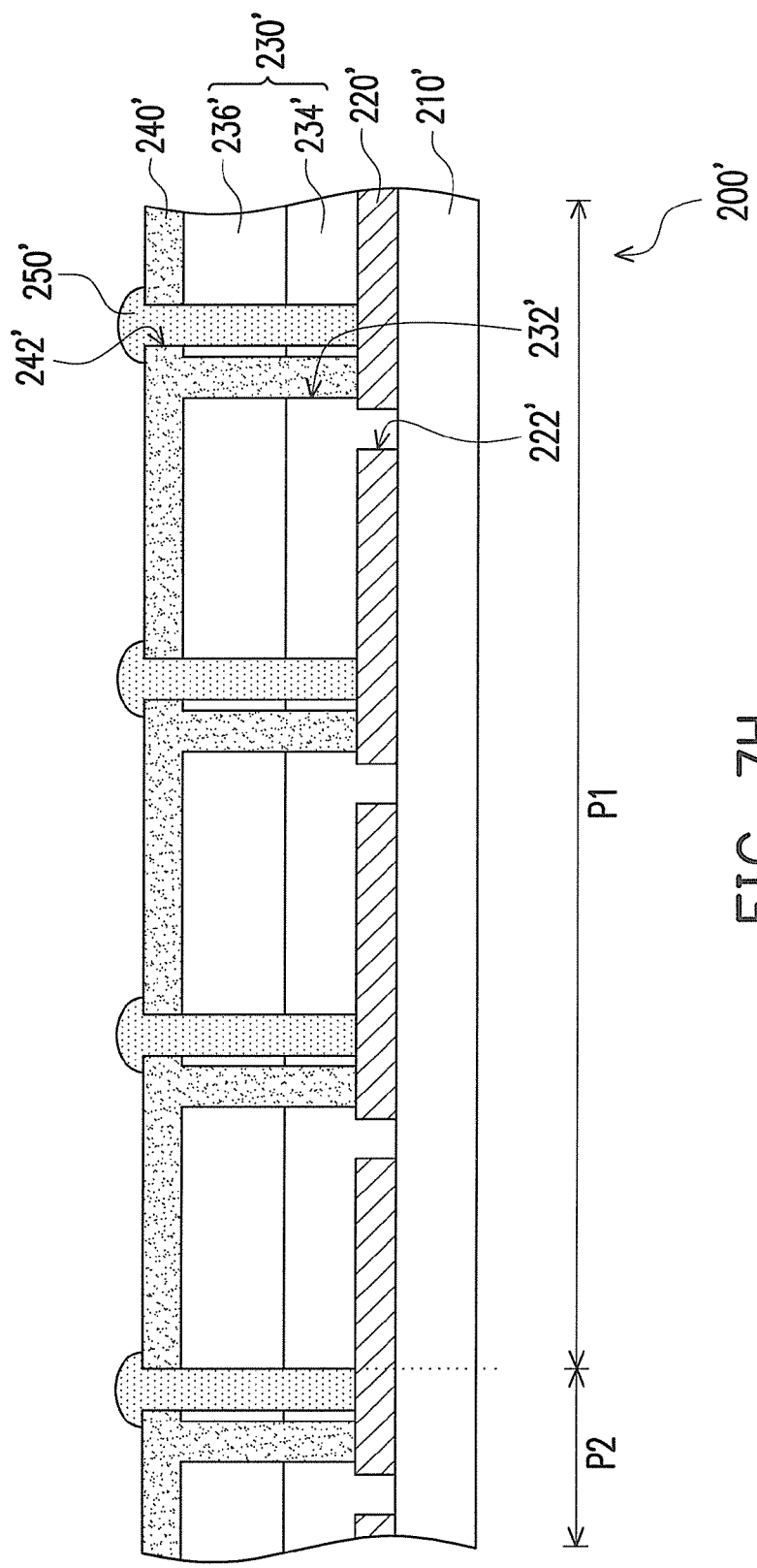

Referring to FIG. 7H, the above-mentioned blocking material 250' is filled in the third openings 242'. The blocking material 250' covers the first conductive layer 220', the side surface of the photoelectric conversion layer 230', and the top and side surface of a portion of the second conductive layer 240' which are exposed by the third openings 242'. In this embodiment, during the step of framing the third openings 242', the blocking material 250' can be simultaneously filled in the third openings 242'. That is, when a laser is performed to form the third openings 242', the blocking material 250' accompanying the laser can be simultaneously filled in the third openings 242'. Accordingly, degradation of film layers caused by moisture penetration is avoided, and the short circuit current (Isc) and shunt resistance of the thin film solar cell 200 are increased to reduce the leakage current possibly generated at the first conductive layer 220' and at the side surface of the photoelectric conversion layer 230'. In addition, the method of filling the blocking material 250' is by performing a dispensing process, an ink-jet printing process, a print screening process, a dry film lamination process or a coating process, for example.

In another embodiment, the step of filling the blocking material 250' can be performed after the step of forming the third openings 242'. The sequence of forming the blocking material 250' and the third openings 242' is decided according to the users' requirements and designs. The manufacturing method of the thin film solar cell 200' is thus completed.

It is noted that when the second conductive layer 240' is a stacked structure of a transparent conductive layer and a reflective layer, the first conductive layer 220' is a transparent conductive layer. Herein, a transparent conductive layer is formed on the photoelectric conversion layer 230', and a reflective layer is then formed on the transparent conductive layer. Thereafter, the process step in FIG. 7H is performed so as to form a thin film solar cell with one-sided illumination. In another case, the first conductive layer 220' can be a stacked structure of a transparent conductive layer and a reflective layer, so as to form another thin film solar cell with one-sided illumination. The manufacturing method has been described above, and the details are not iterated herein. Herein, it is noted that the second conductive layer 240' can only be a transparent conductive layer.

Third Embodiment

Figure 8:
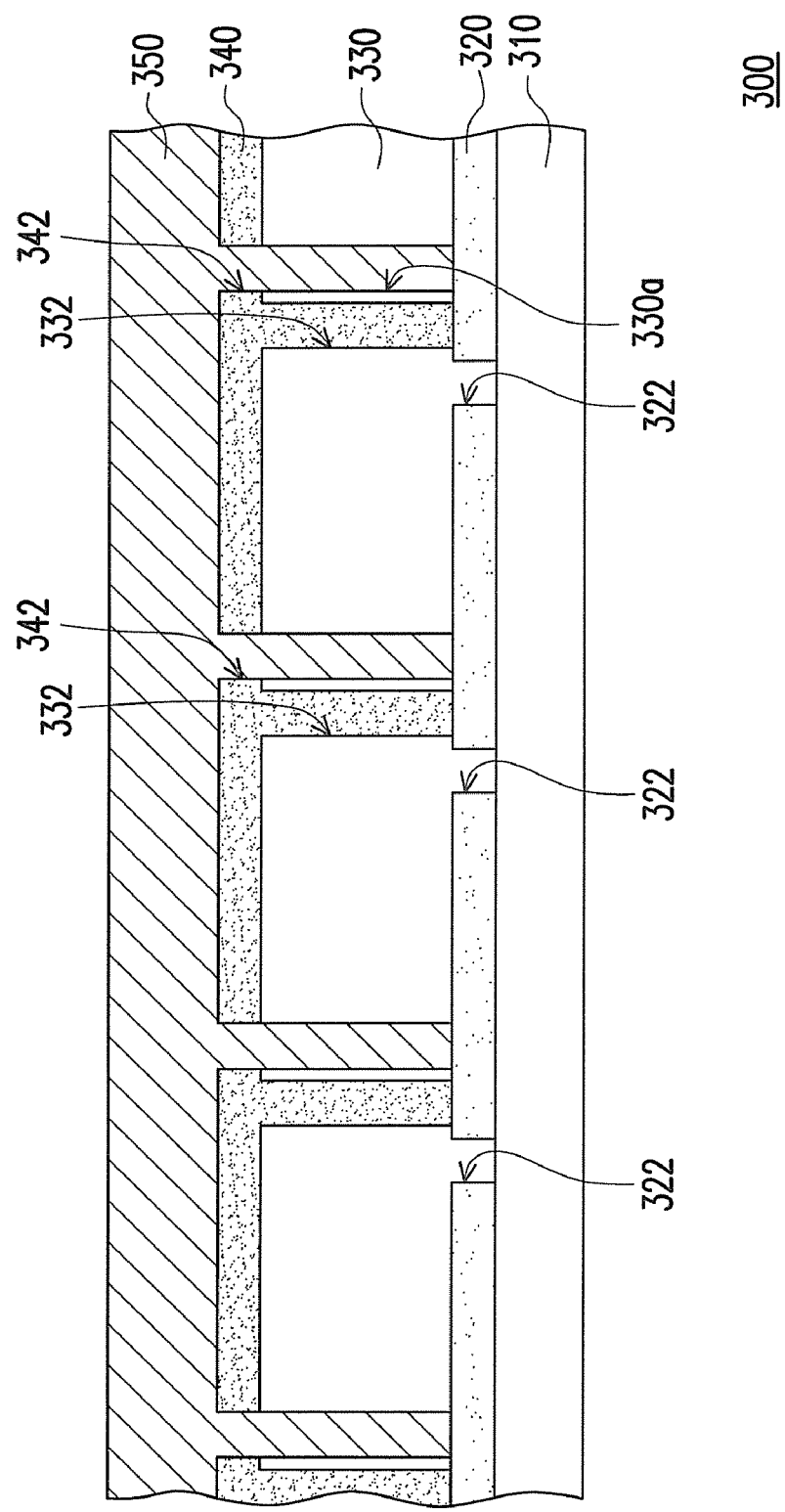
FIG. 8 schematically illustrates a local cross-sectional view of a thin film solar cell according to yet another embodiment of the present invention.

FIG. 8 schematically illustrates a local cross-sectional view of a thin film solar cell according to another embodiment of the present invention. Referring to FIG. 8, in this embodiment, a thin film solar cell 300 includes a substrate 310, a first conductive layer 320, a photovoltaic layer 330, a second conductive layer 340 and a passivation layer 350. In this embodiment, the substrate 310 can be a transparent substrate, such as a glass substrate.

The first conductive layer 320 is disposed on the substrate 310, and has a plurality of first openings 322 to expose the substrate 310, as shown in FIG. 8. In this embodiment, the first conductive layer 320 can be a transparent conductive layer, and the material thereof can be at least one of indium tin oxide (ITO), indium zinc oxide (IZO), indium tin zinc oxide (ITZO), zinc oxide, aluminium tin oxide (ATO), aluminium zinc oxide (AZO), cadmium indium oxide (CIO), cadmium zinc oxide (CZO), gallium zinc oxide (GZO) and fluorine tin oxide (FTO).

In another embodiment (not shown), the first conductive layer 320 can be a stacked layer of a reflective layer (not shown) and the above-mentioned transparent conductive layer, and the reflective layer is disposed between the transparent conductive layer and the substrate 310. The material of the reflective layer can be a metal with higher reflectivity, such as silver (Ag) or aluminium (Al).

Referring to FIG. 8, the photovoltaic layer 330 is disposed on the first conductive layer 320, and has a plurality of second openings 332 to expose the first conductive layer 320. In this embodiment, the photovoltaic layer 330 can be a Group IV thin film, a III-V compound semiconductor thin film, a II-VI compound semiconductor thin film or an organic compound semiconductor thin film. In details, the Group IV thin film includes at least one of an amorphous silicon (a-Si) thin film, a microcrystalline silicon (μc-Si) thin film, an amorphous silicon germanium (a-SiGe) thin film, a microcrystalline silicon germanium (μc-SiGe) thin film, an amorphous silicon carbide (a-SiC) thin film, a microcrystalline silicon carbide (μc-SiC) thin film, a tandem silicon thin film and a triple silicon thin film, for example. The III-V compound semiconductor thin film includes a gallium arsenide (GaAs) thin film, an indium gallium phosphide (InGaP) thin film or a combination thereof, for example. The II-VI compound semiconductor thin film can be a copper indium diselenide (CIS) thin film, a copper indium gallium diselenide (CIGS) thin film, a cadmium telluride (CdTe) thin film or a combination thereof, for example. The organic compound semiconductor thin film includes a mixture of poly(3-hexylthiophene) (P3HT) and PCBM, for example.

That is, the thin film solar cell 300 can at least include the film layer structure of an amorphous silicon thin film solar cell, a microcrystalline silicon thin film solar cell, a tandem thin film solar cell, a triple thin film solar cell, a CIS thin film solar cell, a CIGS thin film solar cell, a GdTe thin film solar cell or an organic thin film solar cell.

Therefore, the photovoltaic layer 330 of this embodiment is provided only for illustration purposes, and is not construed as limiting the present invention. The photovoltaic layer 330 can be decided according to the users' requirements. In other words, the thin film solar cell 300 can also include the film layer structure of another suitable thin film solar cell.

Further, the second conductive layer 340 is disposed on the photovoltaic layer 330 and electrically connected to the first conductive layer 320 through the second openings 332. The second conductive layer 340 has a plurality of third openings 342 to expose the first conductive layer 320 and the sidewall of the photovoltaic layer 330, as shown in FIG. 8. In this embodiment, the second conductive layer 340 can be a transparent conductive layer and includes the material of the first conductive layer 320, and the details are not iterated herein. In this embodiment, the second conductive layer 340 can further include a reflective layer disposed on the transparent conductive layer. It is noted that when the second conductive layer 340 includes a reflective layer, the first conductive layer 320 can only be a transparent conductive layer. On the contrary, when the first conductive layer 320 includes a reflective layer, the second conductive layer 340 can only be a transparent conductive layer without a reflective layer thereon. In an embodiment, each of the first conductive layer 320 and the second conductive layer 340 can be a single transparent conductive layer without a reflective layer thereon. In other words, the design of the first conductive layer 320 and the second conductive layer 340 can be adjusted according to the users' requirements (e.g. for manufacturing a thin film solar cell with double-sided illumination or a thin film solar cell with one-sided illumination). The design of the first conductive layer 320 and the second conductive layer 340 described above is provided only for illustration purposes, and is not construed as limiting the present invention.

Referring to FIG. 8, the passivation layer 350 covers the second conductive layer 340 and the sidewall 330a of the photovoltaic layer 330 in the third openings 342. In this embodiment, the material of the passivation layer 350 can be a reflective material, such as a lead paint or a metal. In details, the passivation layer 350 covers the second conductive layer 340 and the sidewall 330a of the photovoltaic layer 330 in the third openings 342, so as to protect the film layers 320, 330 and 340 from being affected by the external environment such as moisture. Further, the passivation layer 350 of this embodiment covers the sidewall 330a of the photovoltaic layer 330 in the third openings 342, so as to prevent surface recombination of the electron-hole pairs from occurring at the sidewall 330a of the photovoltaic layer 330 in the third openings 342; thus, a leakage current is not generated. In other words, in the thin film solar cell 300 of this embodiment, the passivation layer 350 substantially covers the second conductive layer 340 and the sidewall 330a of the photovoltaic layer 330 in the third openings 342, so that the possibility of generating leakage current is reduced, and the photoelectric conversion efficiency of the thin film solar cell 300 is further improved.

In addition, when the material of the passivation layer 350 is a reflective material, the light re-utilization rate inside the photovoltaic layer 320 is enhanced, and the photoelectric conversion efficiency of the thin film solar cell 300 is further improved. It is noted that when the passivation layer 350 includes a reflective material, the first conductive layer 320 do not need the above-mentioned reflective layer. In an embodiment, the passivation layer 350 can include a solid solute and a liquid solvent, and the solids content of the passivation layer 350 is no less than 30%.

In another embodiment, the passivation layer 350 can be an organic passivation layer. Accordingly, the method of covering the organic passivation layer 350 on the second conductive layer 320 and on the sidewall 330a of the photovoltaic layer 330 includes providing an organic solution (not shown), and then coating the organic solution on the second conductive layer 320 through a coating process. Since the viscosity coefficient of the organic solution is lower, the organic solution can flow into the third openings 342 easily to cover the sidewall 330a of the photovoltaic layer 330. At this time, if a shorter time is desired to cure the organic solution to the organic passivation layer 350, a heat curing treatment can be performed to the organic solution on the second conductive layer 320 and on the sidewall 330a of the photovoltaic layer 330 in the third openings 342, and thus, the organic solution can be cured to the organic passivation layer 350 more quickly.

In another embodiment, the passivation layer 350 can be an insulating passivation layer. The method of covering the insulating passivation layer 350 on the second conductive layer 320 and on the sidewall 330a of the photovoltaic layer 330 includes performing a deposition process, a print screening process, a dry film lamination process, a coating process, a ink-jet printing process or a energy source treatment. In another embodiment, the insulating passivation layer 350 can be formed on the second conductive layer 320 and on the sidewall 330a of the photovoltaic layer 330 through a plasma oxidation process. The plasma oxidation process can be a $CO_2$ plasma oxidation process, for example. In yet another embodiment, the second conductive layer 340 and the sidewall 330a of the photovoltaic layer 330 in the third openings 342 can be exposed to air to form a native oxide layer, wherein the native oxide layer is the insulating passivation layer 350 of this embodiment. In other words, the method of forming the insulating passivation layer 350 depends on the users' requirements. The above-mentioned forming methods are provided only for illustration purposes, and are not construed as limiting the present invention.

In summary, the thin film solar cell of the present invention has the passivation layer disposed between the photovoltaic conversion layer and the second conductive layer. Therefore, when the thin film solar cell is illuminated to process a photoelectric conversion, the generated electron-hole pairs are not easy to recombine near the interface between the photoelectric conversion layer and the second conductive layer. In other words, the thin film solar cell of the present invention can exhibit a higher photoelectric conversion efficiency. Further, the above-mentioned passivation layer can be easily formed through simple steps described in the manufacturing method of the present invention, so that the characteristics of the thin film solar cell are accordingly enhanced.

In addition, the thin film solar cell of the present invention has the blocking material to cover the first conductive layer and the side surface of the photoelectric conversion layer which are exposed by the third openings. Therefore, degradation of film layers caused by moisture penetration is avoided, and the short circuit current (Isc) and shunt resistance are increased to reduce the leakage current possibly generated at the first conductive layer and at the side surface of the photoelectric conversion layer. Accordingly, the electrical performance and photoelectric conversion efficiency of the thin film solar cell are further improved.

Besides, in the thin film solar cell of the present invention, the passivation layer having an insulating property covers the sidewall of the photovoltaic layer in the third openings, so as to prevent surface recombination of electron-hole pairs from occurring at the sidewall of the photovoltaic layer in the openings. Accordingly, the photoelectric conversion efficiency of the thin film solar cell is enhanced. Further, in the manufacturing method, at least one coating process is performed, so that the passivation layer substantially covers the sidewall of the photovoltaic layer in the openings to achieve the above-mentioned advantages.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A thin film solar cell, comprising:
    a substrate;
    a first conductive layer, disposed on the substrate and having a plurality of first openings to expose the substrate;
    a photovoltaic layer, disposed on the first conductive layer and having a plurality of second openings to expose the first conductive layer;
    a second conductive layer, disposed on the photovoltaic layer, electrically connected to the first conductive layer through the second openings, and having a plurality of third openings to expose the first conductive layer and a sidewall of the photovoltaic layer; and
    a passivation layer, covering the second conductive layer and the sidewall of the photovoltaic layer in the third openings, the passivation layer being a reflective material, the reflective material being a lead paint.

* * * * *